United States Patent
Shannon

[19]

[11] Patent Number: 5,973,335
[45] Date of Patent: *Oct. 26, 1999

[54] SEMICONDUCTOR MEMORY DEVICES WITH AMORPHOUS SILICON ALLOY

[75] Inventor: John M. Shannon, Whyteleafe, United Kingdom

[73] Assignee: U.S. Philips Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/574,800

[22] Filed: Dec. 19, 1995

[30] Foreign Application Priority Data

Dec. 22, 1994 [GB] United Kingdom .................... 9426008
Aug. 3, 1995 [GB] United Kingdom .................... 9515961

[51] Int. Cl.[6] .......................... H01L 39/04; H01L 31/036
[52] U.S. Cl. ............................. 257/49; 257/52; 257/53; 257/54; 257/63; 257/70; 257/72; 257/196; 365/129
[58] Field of Search .................. 257/49, 52–54, 257/63, 70, 72, 196, 530; 365/129

[56] References Cited

U.S. PATENT DOCUMENTS

| | | | |
|---|---|---|---|
| 3,611,063 | 10/1971 | Neale | 257/530 |
| 4,217,374 | 8/1980 | Ovshinsky et al. | 427/39 |
| 4,226,898 | 10/1980 | Ovshinsky et al. | 427/39 |
| 4,488,262 | 12/1984 | Basire et al. | 257/530 |
| 4,499,557 | 2/1985 | Holmberg et al. | 257/530 |
| 4,599,705 | 7/1986 | Holmberg et al. | 257/530 |
| 4,868,616 | 9/1989 | Johnson et al. | 257/63 |
| 5,210,766 | 5/1993 | Winer et al. | 257/52 |
| 5,233,206 | 8/1993 | Lee et al. | 257/530 |
| 5,293,335 | 3/1994 | Pernisz et al. | 257/2 |
| 5,367,392 | 11/1994 | Janai | 257/72 |
| 5,477,482 | 12/1995 | Prinz | 365/129 |

FOREIGN PATENT DOCUMENTS

| | | | |
|---|---|---|---|
| 0588402 | 3/1994 | European Pat. Off. | G11C 17/14 |
| 9000817 | 1/1990 | WIPO . | |
| 9013921 | 11/1990 | WIPO . | |

OTHER PUBLICATIONS

"Metal–Semiconductor Transition in Electroformed Chromium/Amorphous Silicon/Vanadium Thin–Film Structures", by J. Hajto et al, Philosophical Magazine B., 1994, vol. 69, No. 2, 237–251.

Primary Examiner—William Mintel
Attorney, Agent, or Firm—Steven R. Biren

[57] ABSTRACT

A semiconductor memory device includes first and second conductive contact layers (12, 15) and an hydrogenated, silicon-rich, amorphous silicon alloy layer (14), particularly an amorphous silicon nitride or amorphous silicon carbide alloy, extending between the contact layers. A defect band is induced in the amorphous silicon layer which lowers the activation energy level for the transport of carriers through the structure by an amount that is selectable and determined by the defect band. The defect band is created by a programming process, for example, using current stressing or particle bombardment. A memory matrix array device is provided by forming a row and column array of such memory devices from common deposited layers on a common substrate with crossing sets of row and column conductors separated by a layer of the alloy material defining a memory device at each of their cross-over regions. A plurality of overlying arrays of memory devices may be stacked on the support to provide a 3-D memory structure in a simple manner.

15 Claims, 5 Drawing Sheets

SEMICONDUCTOR MEMORY DEVICES WITH AMORPHOUS SILICON ALLOY

BACKGROUND OF THE INVENTION

The present invention relates to a semiconductor memory device comprising two spaced, electrically conductive contact layers and a layer comprising amorphous silicon material extending between the contact layers, and methods of producing such. The invention relates also to memory matrix array devices using such memory devices.

A semiconductor memory device of the above kind is described in PCT WO 90/13921. This device comprises a thin layer of amorphous silicon material on one side of which is provided a first conducting layer, such as chromium, and on the other side of which a second conducting layer of a selected metal, such as vanadium, is deposited. The amorphous silicon layer may be hydrogenated n type, doped with phosphorous, or hydrogenated p type, doped with boron, having a thickness in the range 20 to 350 nm and is preferably doped to have a conductivity in the bulk state of at least $10^{-6}$ (ohms cm)$^{-1}$. In order for the device to perform a memory function, its electrical characteristics are altered by a so-called forming process which involves applying a voltage, or series of voltages, across the device which convert its structure to one having analogue memory properties. This forming process has the effect of reducing the device resistance, from around $10^9$ ohms prior to this process by, for example, around two orders of magnitude. After this forming, the device can be set and reset to a resistance which is a measure of an applied voltage, the resistance value being retained after removal of the applied voltage thereby providing a programmed device. The device differs in this respect from devices which only retain a given state while maintained by a holding voltage and from known binary memory devices which effectively store just two values in response to two respective ranges of voltages.

An explanation of the change in the structure and behaviour resulting from such a forming process, given in the paper entitled "Metal-semiconductor transition in electroformed chromium/amorphous silicon/vanadium thin-film structures" by J. Hajto et al in Philosophical Magazine B. 1994, Vol. 69, No. 2, pages 237–251, is that the forming process creates a localised filamentary region which is highly conducting. It is suggested in this paper that the filamentary region, which can be less than 0.5 micrometers in diameter, is likely to be caused by the top metal diffusing into the doped amorphous silicon layer during the forming process which produces a region of mixed metal and silicon of some form. Experiments reported in that paper involved Cr/p$^+$a-Si:H/V sandwich structures having an active area of 10 micrometers in diameter and with the amorphous silicon layer being 0.01 micrometers in thickness. The structures initially have a low voltage resistance of around $10^9$ ohms, due, it is said, to metal-semiconductor Schottky barriers at the contacts, which is lowered to around $10^3$ ohms by a forming process that involves applying a sequence of single 300 ns voltage pulses of increasing magnitude to around 14V with the top, vanadium, contact being of positive polarity. Following this forming, the structure exhibits fast analogue memory switching by demonstrating non-volatile resistance states between Ron equal to $10^3$ ohms and Roff equal to $10^6$ ohms under the influence of a single voltage pulse of 100 ns duration and of magnitudes between 2 and 6v. Similar results are described in the aforementioned PCT WO 90/13921. In one described example using the formed device as a memory element, a positive, WRITE, pulse of 3.4V and 100 ns duration is applied to the chromium contact resulting in an ON state of $2\times10^3$ ohms and an opposite polarity, ERASE, pulse is applied at successively higher voltages through which it was found that at a certain threshold voltage the device resistance gradually increases with each successively higher applied voltage until at around 3.0 V a final resistance state of approximately $4\times10^5$ ohms is achieved. All these states were non-volatile and stable with the device retaining the conductivity state to which it had last been set. Between the upper and lower switching thresholds the device resistance is primarily a function of applied voltage pulse. According to experimental results given in the paper by Hajto et al, the I–V characteristics of the device for different analogue memory states are generally symmetrical and linear. The analogue memory semiconductor devices are suitable for use, for example, as non-volatile, and reprogrammable, memory elements in analogue neural networks.

In PCT WO 90/00817 there is described an electrical switching device which comprises an amorphous silicon compound layer formed by reacting amorphous silicon or an amorphous silicon compound such as amorphous silicon carbide, oxide or nitride, with a passivating agent such as hydrogen, and two conducting electrodes on the amorphous silicon compound layer. The device initially has a relatively high resistance and is similarly subjected to a forming operation by applying a high voltage which is said to cause a disc like area of crystalline elemental silicon to be formed together with the loss of the overlying part of an electrode, thus creating a localised filament through the device. Once formed in this way, the device exhibits a voltage controlled negative resistance whereby it has a low resistance until it is subjected to a high voltage or current whereupon it has a high resistance. The change in resistance effect is explained as being due to ohmic heating in the filamentary region and the thermionic and/or field effect emission of electrons from that region into regions having lower electron mobilities.

SUMMARY OF THE INVENTION

It is an object of the present invention to provide an improved semiconductor memory device.

It is another object of the present invention to provide memory arrays using such memory devices.

According to a first aspect of the present invention, there is provided a method of producing a programmed semiconductor memory device which device comprises a structure comprising two, spaced, electrically conductive contact layers and a layer of amorphous silicon material extending between the contact layers, characterised in that the amorphous silicon material comprises an hydrogenated, silicon-rich, amorphous silicon alloy containing at least one other element in addition to hydrogen and silicon, and in that a programming process is performed in a region of the structure to induce a defect band throughout that region of the hydrogenated, silicon rich, amorphous silicon alloy layer which lowers the activation energy for the transport of carriers therein by a selected amount which can be varied according to the programming process.

According to another aspect of the present invention, there is provided a programmable semiconductor memory device comprising two spaced, conductive, contact layers and a layer of amorphous silicon semiconductor material extending therebetween, characterised in that the amorphous silicon material comprises an hydrogenated, silicon-rich, amorphous silicon alloy which contains at least one other element in addition to hydrogen and silicon and which has an activation energy for the transport of carriers between the contact layers that is alterable by inducing a defect brand in the amorphous silicon alloy layer so as to program the device.

According to a further aspect of the present invention there is provided a programmed semiconductor memory device comprising two spaced, conductive, contact layers and a layer of amorphous silicon material extending therebetween, characterised in that the amorphous silicon material comprises an hydrogenated, silicon rich, amorphous silicon alloy containing at least one other element in addition to silicon and hydrogen, and in that the amorphous silicon alloy layer has a defect band created therein which lowers the activation energy for transport of carriers between the conductive contact layers by a selected amount which is determined by the defect band.

By tailoring the defect band, or more specifically the concentration and distribution of energies of the defects in the defect band, the extent of lowering of the activation energy level of the device, which is dependent on and determined by the defect band, can be selectively set to provide a desired programme state for the device.

In a preferred embodiment, the hydrogenated, silicon rich, amorphous silicon alloy material preferably comprises an hydrogenated, silicon rich, amorphous silicon nitride alloy in which the ratio of nitrogen to silicon is less than 1.0 and preferably greater than around 0.2. In an alternative embodiment the alloy may comprise an hydrogenated silicon rich, amorphous silicon carbide alloy. By silicon-rich it is meant that the concentration of silicon atoms in the alloy is larger than the concentration of atoms of the constituent elements other than silicon and hydrogen. The amount of at least one other element in the alloy, e.g. nitrogen or carbon in preferred embodiments, should be appreciable and such that it is effective to increase noticeably the band gap of the material. The ratio of nitrogen to silicon, for example is, therefore, preferably greater than 0.2. Other than nitrogen or silicon, no further element or elements are required in the alloy material to form the defects comprising the defect band.

It is envisaged that other hydrogenated, silicon rich, amorphous silicon alloys, for example comprising silicon oxide or silicon oxynitride, may be used and also that other materials such as germanium could be incorporated in the alloy. The alloy could also include some dopant (n or p type) although preferably the alloy is in an intrinsic, undoped, form.

The programming process preferably comprises a current stressing operation in which an electric current is passed through the structure, using the two conductive contact layers as terminals, at a current density sufficient to create a defect band. In this case, the region of the structure, or more particularly the region of the alloy layer, upon which the programming process is performed is that through which the electrical current flows. The defects in the defect band comprise silicon dangling bonds in the region of the valence band in the alloy. By varying the magnitude of the electrical current, and/or the time for which it is applied, the activation energy level of the device in subsequent use can be predetermined and selected from a range of possible values, thereby programming the device. The activation energy level decreases progressively in accordance with, for example, an increase in the applied current stressing time, assuming constant current density. The creation of a defect band distinguishes the device from the known kind of memory devices in which localised filaments are produced in the amorphous silicon layer through the forming process.

It is envisaged that other techniques may be employed to induce the defect band. In particular, the programming process may instead comprise bombarding the region of the alloy layer between the contact layers with energetic particles, i.e. ions, (for example, protons) or electrons, or possibly even energetic photons, at sufficient energy levels to break internal bonds in the alloy material, and thereby form the defect band.

The semiconductor memory device is non-volatile and once programmed will retain its programmed state provided that the currents used to read the device in subsequent use are sufficiently low compared with those used in the programming process to prevent further change to the programmed activation energy level. The device can be reprogrammed to an extent, and depending on its existing programmed state, by continuing at a later time the programming process, using current stressing (or bombardment) to lower its activation energy level further. However, it cannot be reprogrammed to raise its activation energy level by this process. Reprogramming to both higher and lower activation energy levels can be accomplished if required by subjecting the device to an annealing operation which can either increase the activation energy level or, if an adequately high annealing temperature is used, return the device to its original, unstressed, condition and then allow a fresh programming process to be performed to set the device to the desired programme state. The fact that annealing can be used in this way clearly demonstrates that no filamentary action caused by contact material diffusion is involved. The programmed semiconductor memory devices are effectively analogue memory devices since the amount by which their activation energy level is reduced, which determines their memory state, can be selected from a more or less continuous range, rather than, for example, just two possible states.

The programmable semiconductor devices of the present invention differ from the known kind described previously in that their structure and operation do not involve or depend on the presence of filaments. Rather, their operation depends on the defect band introduced as a result of the forming process which leads to the device having a bulk controlled effect rather than a filamentary effect as in the known devices.

The invention offers a number of advantages. Importantly, the device structure and its method of fabrication are highly reproducible unlike the filamentary type devices in which, because the choice of materials, and the fabrication processes appear to play a critical part and because the mechanisms involved are less well understood, there is a tendency for the effects to be difficult to reproduce. The memory devices of the present invention are capable of being programmed over a comparatively wide range, for example, around three orders of magnitude or more. Another significant advantage is that the region of the defect band, and thus the programmable region, in the device is determined substantially by the region through which current flows when using current stressing or the bombarded region so that the behaviour of individual devices in an array of such devices is more predictable and similar whereas with the known filamentary type devices filamentary conduction in an array of devices could show considerable variability from device to device.

The invention stems from a recognition of the fact that the excess leakage in hydrogenated, silicon rich, amorphous silicon alloy materials caused through prolonged electrical current stress can be used to advantage. It has been observed from work on silicon rich amorphous silicon alloy devices such as a-Si Nx:H and a-SiCx:H thin film diodes used as switching devices in active matrix liquid crystal display panels, which devices similarly comprise a layer of the amorphous silicon alloy sandwiched between opposing conductors, that prolonged current stress, resulting from comparatively high current densities being passed through these switching devices, causes ageing effects in the form of a drift in the device I–V characteristic and if sufficiently great can lead to an irreversible change in the device to a state in which it exhibits excess leakage. The phenomenon responsible for this effect has now been identified as being due to the formation of a defect band induced by hole injection. Whilst this change is wholly undesirable when said devices are intended to be used as switching devices in active matrix display devices wherein the devices act as non-linear resistance devices exhibiting a threshold effect and for which purposes the I–V characteristics of the devices should be substantially symmetrical, stable and uniform over a range of operating drive voltages, it has been recognised by the inventor that this apparently unwanted effect can be exploited to advantage by using the device for other purposes, namely as a programmed semiconductor device in the manner of a memory element. It has been determined that the phenomenon responsible for the creation of a defect band, leading to leakage, is particularly strong in hydrogenated silicon rich amorphous silicon alloys because there is more disorder than in a-Si:H. In realising that the defect band grows during current stressing and that the device resistance, and its activation energy level can be determined, it was recognised that this behaviour can be utilised as a programming technique.

It has also been appreciated that the required defect band can be generated by ways other than current stressing, for example by ion bombardment.

The two conductive contact layers may be provided spaced apart on the same surface of the layer of hydrogenated, silicon rich amorphous silicon alloy. Preferably, however, the layer of hydrogenated, silicon-rich, amorphous silicon alloy is sandwiched between the two conductive contact layers. This has the advantage in that the amount of silicon alloy between the contacts is determined by the thickness of the alloy layer and can, therefore, be precisely controlled.

The conductive contact layers are preferably of metal although other conductive materials such as ITO or doped, e.g. n+ type, amorphous silicon could be used. In use of the programmed semiconductor device, the electrical current through the device during reading is largely independent of the contact material.

An array of the memory devices may be used to provide a memory matrix array device. A planar array of memory devices can be provided by fabricating the memory devices in accordance with the first aspect of the present invention on a common support from common deposited layers. A planar array of memory devices arranged in rows and columns on the support and with a first of the two contact layers of each of the memory devices in a respective row being electrically connected together and with the second of the two contact layers of each of the memory devices in a respective column being electrically connected together can be fabricated easily using conventional thin film technology. Preferably, overlying sets of row and column conductors, comprising conductive strips, may be formed on the support which are separated at their crossover regions by an intervening layer of the amorphous silicon alloy, preferably provided as a continuous layer extending between the sets of conductors and over the area of the intended array so as to produce at each cross-over region between a row conductor and column conductor a memory device whose two contact layers comprise respective portions of a row conductor and a column conductor. After producing this structure, the memory devices can be programmed by passing an electrical current through a memory device in the array via its associated row and column conductors from a suitable source connected to the ends of the row and column conductors or by localised bombardment. Readout from the devices is accomplished by addressing the memory devices via the row and column conductors. The matrix memory device is very easy to produce with thin film circuit technology, as used in other large area electronic devices such as active matrix LC display devices, and requires only very simple processing steps, unlike known kinds of thin film memory arrays using TFTs (thin film transistors), for example as described in EP-A-0588402.

In a particularly preferred embodiment, the memory array device comprises a plurality of such planar memory device arrays overlying one another on the common support, thereby forming a 3D, multi-plane, memory device structure of greater capacity. The plurality of arrays can be fabricated in succession on the support. The arrays may each have their own, separate, sets of row and column conductors and adjacent arrays may be separated by a layer of insulating material, such as silicon nitride or polyimide. Preferably though, a set of conductors, for example row conductors, serving as, for example, the upper contact layers of the memory devices in one array, also serves to provide a set of conductors constituting the lower contact layers of the memory devices in an adjacent array. Thus, in the case of just two overlying arrays of memory devices being provided, only three sets of conductors, for example two sets of column conductors and one, shared, set of row conductors need be provided and in the case of five overlying arrays being provided only six sets of conductors are required in total. This reduction in conductor sets adds to the ease of fabrication. The 3D multi-level structure can be fabricated simply by building one layer on top of another to provide each array in succession on the support with, apart from the upper and lower arrays, only one mask being needed for each array level to define a set of conductors. Programming and read-out of the memory devices in the multi-level 3D array is accomplished using electrical currents supplied via the row and column conductors, of each array.

BRIEF DESCRIPTION OF THE DRAWINGS

Semiconductor memory devices, memory array devices, and methods of producing such in accordance with the invention will now be described, by way of example, with reference to the accompanying drawings in which.

Figure 1:
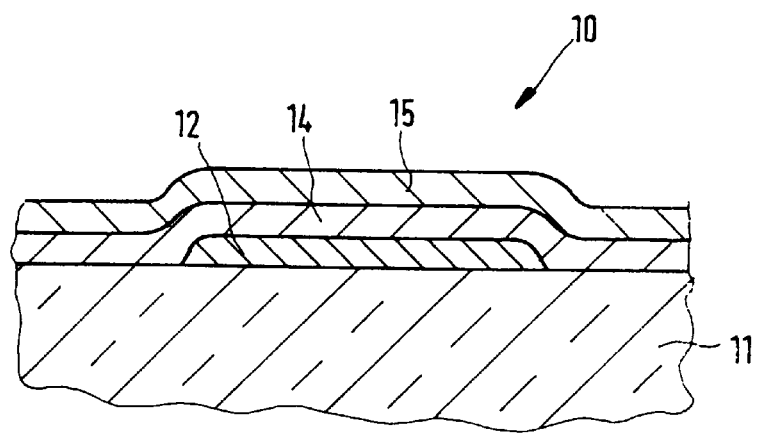
FIG. 1 is a simple schematic cross section view through an embodiment of a programmed semiconductor device according to the invention.
Figure 6:
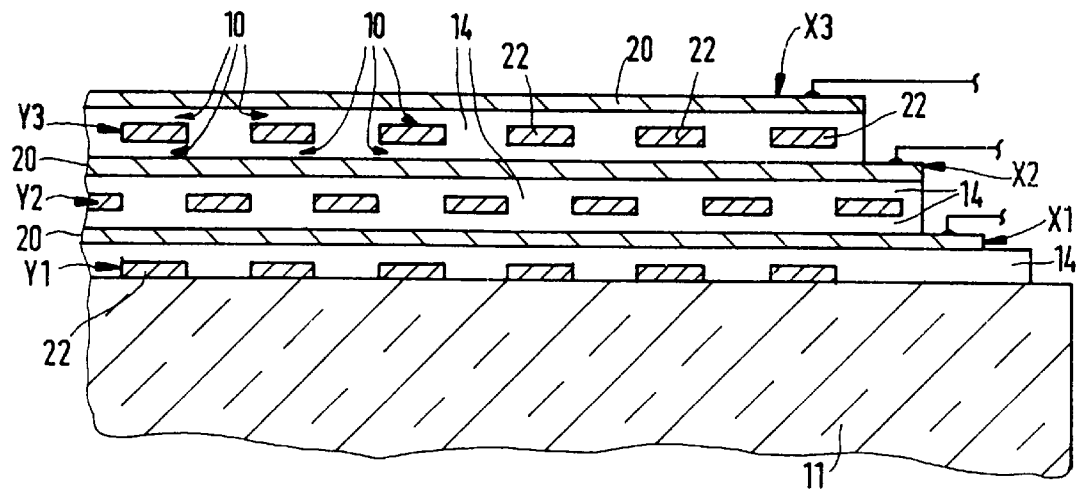
FIGS. 6 and 7 are simplified schematic sectional and plan views respectively of a part of an embodiment of a memory matrix array device according to the invention.
Figure 7:
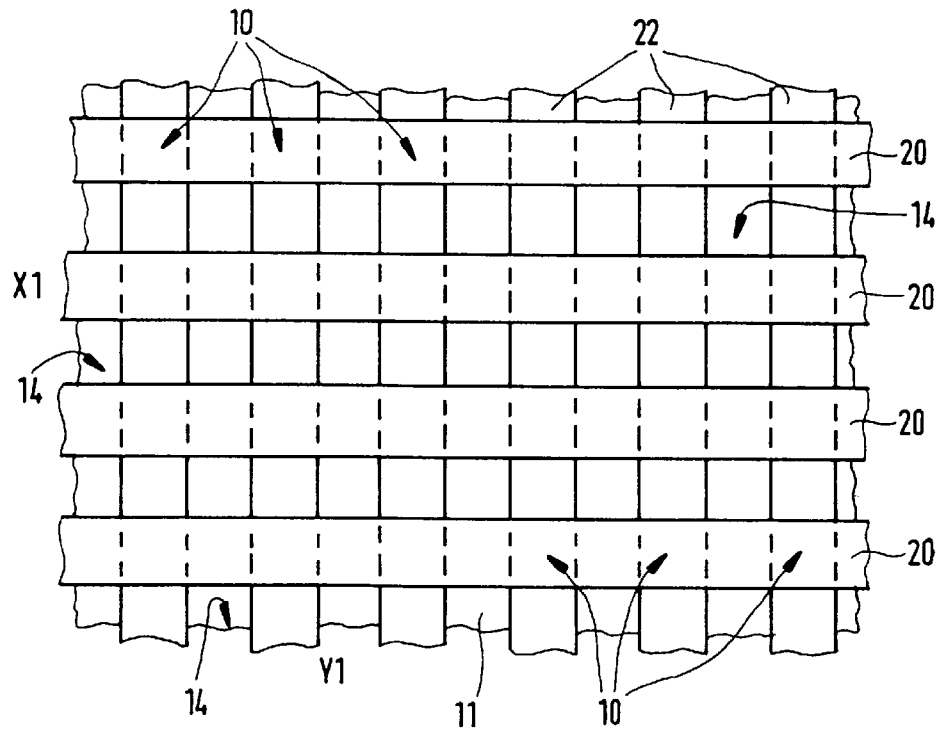

It should be understood that, with regard to FIGS. 1, 6 and 7 in particular, the figures are merely schematic and are not drawn to scale. Certain dimensions such as the thickness of layers or regions may have been exaggerated whilst other dimensions may have been reduced. The same reference numerals are used throughout the Figures to indicate the same or similar parts.

DESCRIPTION OF THE PREFERRED EMBODIMENTS

Referring to FIG. 1, the semiconductor memory device, generally referenced at 10, comprises a multi-layer thin film structure carried on an insulating support 11, for example of glass. The structure consists of a lower electrically conducting contact layer 12 of, for example a metal such as chromium, deposited directly on the support surface, a thin layer 14 of hydrogenated, silicon rich, amorphous silicon nitride material directly overlying the conducting layer 12, and an upper conducting contact layer 15, of for example, molybdenum, which directly overlies the layer 14. The layer 15 extends laterally over the support away from the layer 12 to provide a first contact region. The layer 12 similarly extends over the support surface, in a direction out of the plane of the drawing, to provide a second contact region.

The device is fabricated by depositing by evaporation the lower contact material, in this example chromium, to a thickness of approximately 100 nm, although this is not critical, over the support surface and photolithographically defining this layer to leave a strip shape layer of chromium. Thereafter, the layer 14 is grown directly over the layer 12 of the surrounding surface and the support 11 using a PECVD (Plasma enhanced chemical vapour deposition) process from silane and nitrogen to a uniform thickness of approximately 100 nm. The silane and nitrogen are admitted to the vacuum system at a temperature of approximately 250° so as to produce an hydrogenated, silicon rich, amorphous silicon nitride (a-SiNx:H) alloy layer. The proportions of nitrogen and silicon are selected such that the ratio of nitrogen to silicon in the resulting layer is less than 1.0 and greater than 0.2 (0.2.<N:Si<1.0), and in this particular embodiment is equal to approximately 0.5.

The second, upper, conducting contact layer is then formed by depositing a layer of molybdenum over the structure on the support, again to a thickness of around 100 nm although this can be varied, which layer is patterned photolithographically to leave a strip constituting the contact layer 15 extending over the surface of the layer 14 and crossing over the layer 12. A portion of the layer 14 overlying the layer 12 at a position away from the cross-over region is removed to allow electrical contact to be made with the layer 12.

The structure thus obtained at the cross-over region consists of the layer 14 of silicon rich a-SiNx:H sandwiched between, and directly contacted on either side by, the opposing conducting layers 12 and 15. The cross-over region is approximately ten micrometers square.

This metal-semiconductor-metal (MSM) structure constitutes a thin film diode device which basically comprises a back to back Schottky barrier device. The I–V characteristic of this device at this stage is illustrated graphically in FIG. 2 in which a voltage applied to the contact layers 12 and 15 is plotted against the log of the current density, J, through the device.

Figure 2:
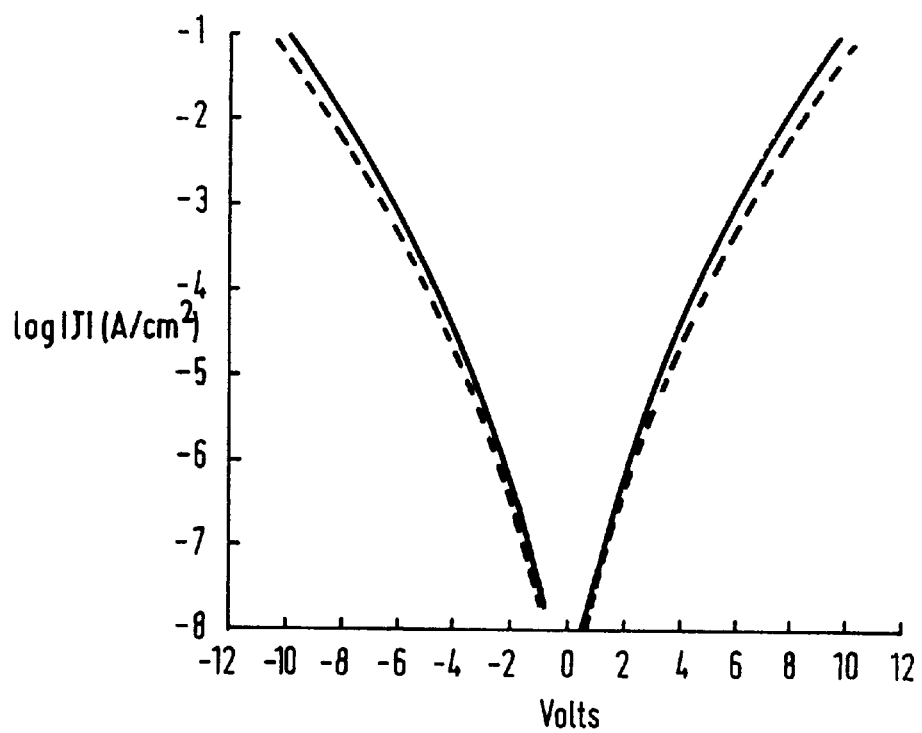
FIG. 2 graphically illustrates the I–V characteristic of the device at an intermediate stage of fabrication.

As the current through the device is mainly carried by electrons, it is the negatively biassed cathode contact that determines the magnitude of the current through the device. More precisely it is the magnitude of the electric field that determines the amount of quantum mechanical tunnelling through the cathode barrier, so any change of this field will change the current-voltage characteristic. Referring to FIG. 2, the I–V characteristic is close to an exponential at low currents and is consistent with thermionic-field emission through a reverse biassed contact with a tunnelling effective mass of approximately 0.1 $m_e$.

MSM thin film diodes devices similar to that described above have been employed as switching elements in active matrix liquid crystal display devices in which the switching element is connected in series with an associated display element and used, by the appropriate application of drive voltages across the series combination, to control the charging of the display element for display purposes.

After fabricating the structure shown in FIG. 1, it is subjected to a programming process in order to provide a programmed semiconductor device. In this particular embodiment, this process entails passing an electrical current through the structure, using the upper and lower conducting layers as contacts, which provide a source of carriers that pass through the layer 14 under the influence of the electric field, at a current density whose magnitude is sufficient to generate defects and induce a defect band in the amorphous silicon alloy layer 14. The defect band is created throughout the region of the layer 14 where electrical current flows during this process. The effect of this defect band is to lower the activation energy for transport of carriers through the device, the amount of lowering being selectable and dependent on the concentration and distribution of energies of the defects which in turn is dependent on and determined by the extent of the current stressing during this process, and more particularly the current density and the amount of charge passed. This behaviour enables the device to be used as a programmable device.

It has been observed when using MSM thin film diode, TFD, devices of the above kind that after a period of use the I–V characteristic can change due to current stressing effects. To begin with, this change is in the form of a shift in the I–V curves, as indicated by the dotted lines in FIG. 2, following the application of positive and negative voltage pulses, that is almost symmetric. After more prolonged current stressing, it has been found that the I–V characteristic degrades symmetrically and that leakage is apparent at low voltages. This drift in the I–V characteristic and the onset of leakage current limits the performance of such a TFD in applications like display devices as a switching element because the former can require the selection voltages used to drive the display elements to be increased whilst the latter determines the end-of-life of the device as suitable switching element. The present invention stems from a realisation that these phenomena, which are undesirable in a TFD for use as a switching element in an active matrix display device, can actually be employed to advantage in producing a device suitable for an altogether different function as a programmable semiconductor device. By deliberately introducing a defect band, the device can be utilised to perform a function similar to that of, for example, the programmable semiconductor device described in PCT WO 90/13921.

One possible explanation for the effects of such current stressing in the TFD device will now be given. The defect band induced by current stressing enables current to flow from anode to cathode in parallel with the current passing over the potential barrier. The shift in the I–V characteristic at higher applied voltages observed after stressing is almost symmetric which suggest that the electric field in both arms has been reduced by approximately the same amount at a given applied bias. The simplest explanation of this drift is to assume that defects, comprising silicon dangling bands in the region of the valence band, have been introduced during current stressing that trap electrons uniformly through the a-SiN$_x$:H layer and reduce the electric field at the negative contact.

The mechanism responsible for defect generation in the layer 14 involves hole-electron recombination for supplying the energy needed to break bonds in the material and the cooling of electrons injected into the anode to supply the energy required to excite holes over the potential barrier at the positively biassed anode. Since the defect centres are believed to be silicon dangling bonds the probability of forming a centre will be related to the concentration of weak Si—H and Si—Si bonds. These in turn depend on the concentration of hydrogen and nitrogen in the material.

The hole-electron recombination and electron cooling model can be used to explain a dependence between the shift in the I–V characteristic, the current density, the thickness of layer 14, time, and a constant determined by the properties and the material.

The I–V characteristics of the device structure using silicon rich silicon nitride are determined by the barriers at each of the interfaces between the layer 14 and the layers 12 and 15. During current stressing meta-stable defects are generated which change the electronic properties of the amorphous silicon nitride layer 14. The generation of defects is more pronounced in silicon rich a-SiN$_x$:H compared with a-Si:H due to the increased disorder caused by the addition of nitrogen.

Figure 3:
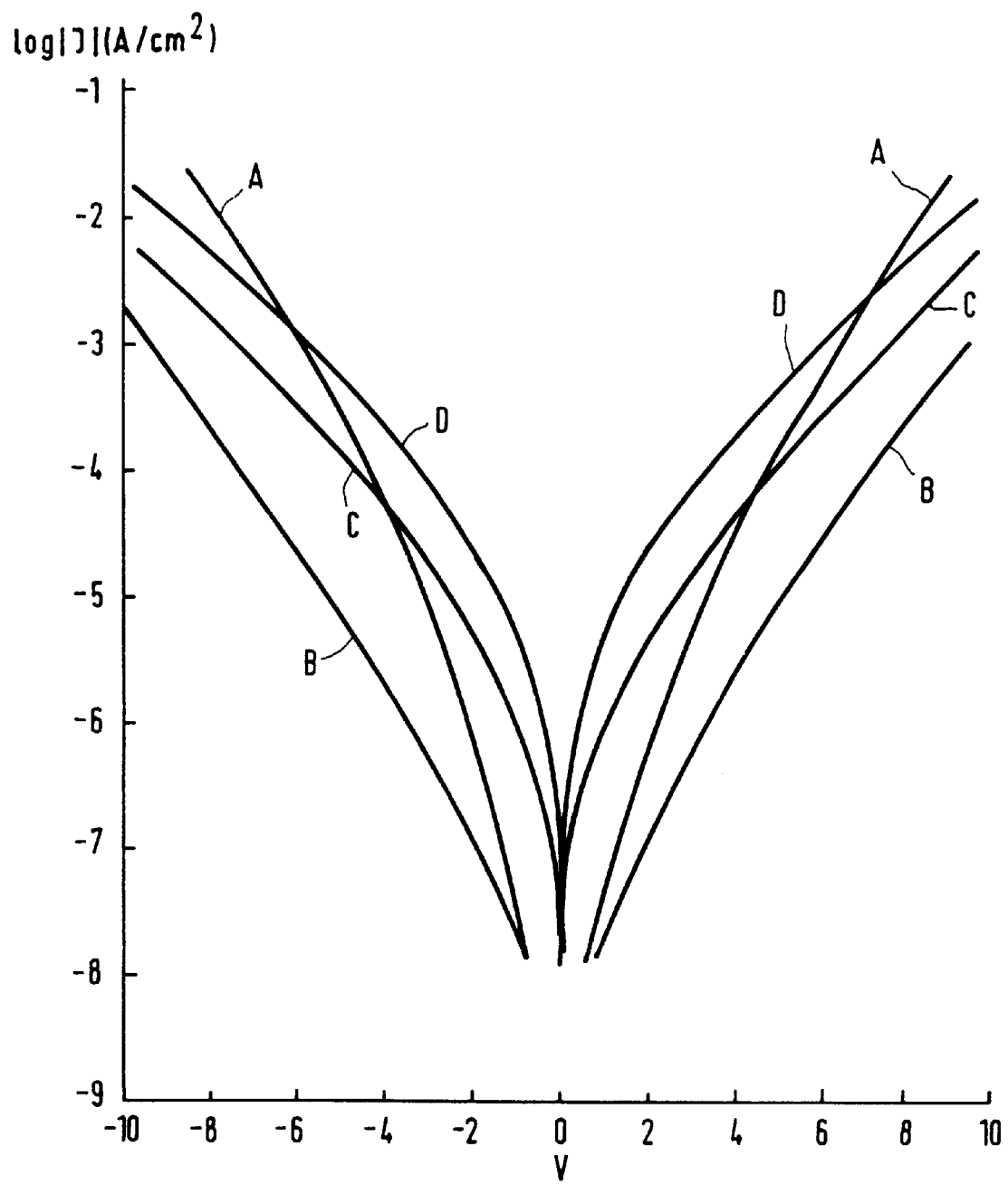
FIG. 3 is a graph of the I–V characteristics of the device illustrating the changes which occur as a result of current stressing from a programming process.
Figure 4:
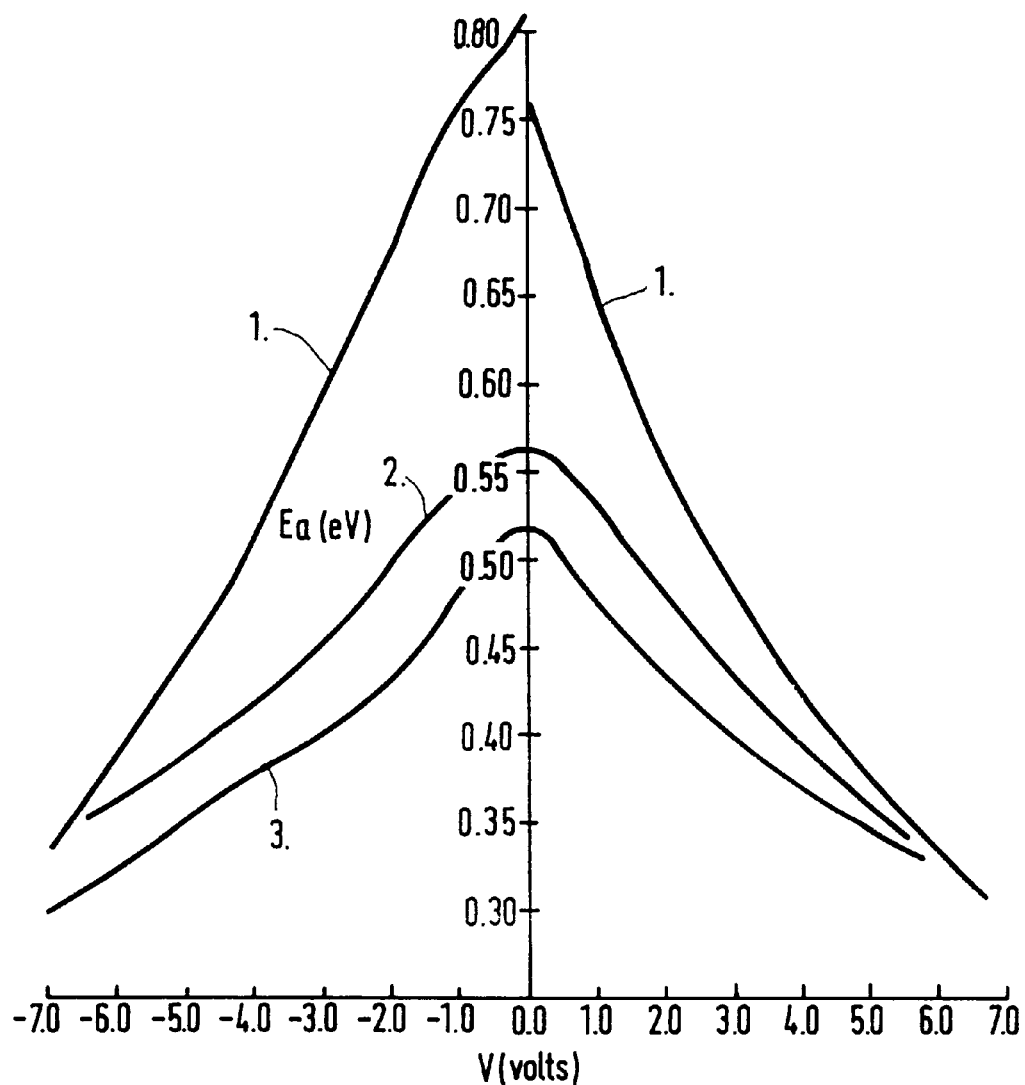
FIG. 4 is a graph illustrating the activation energy of example devices against applied electric field.
Figure 5:
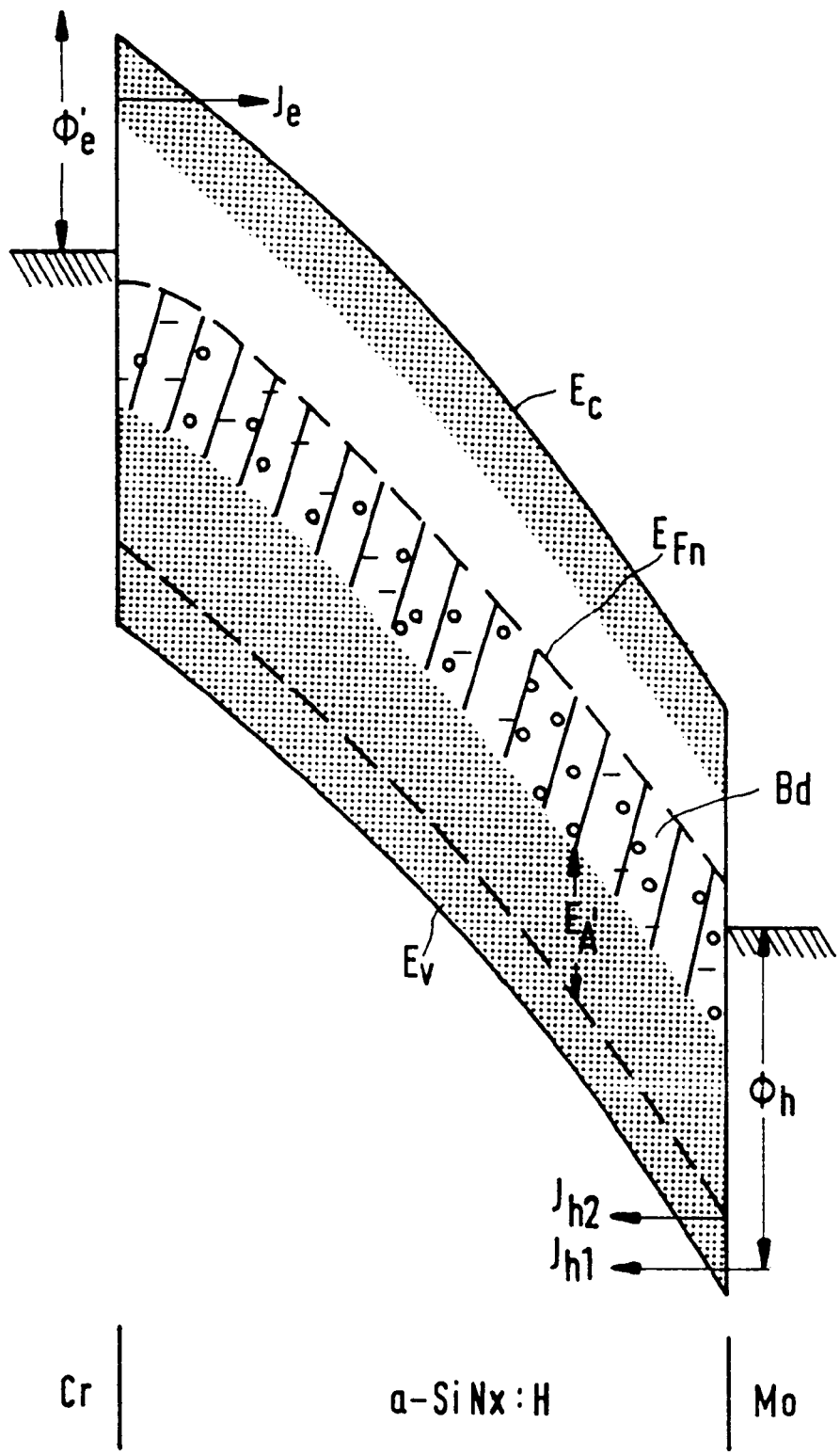
FIG. 5 is an energy band diagram of the semiconductor memory device.

When the device is subjected to prolonged current stress, a further phenomenon occurs that enables current to pass between the contact layers 12 and 15 at comparatively low voltages. As current stressing proceeds further, the magnitude of this leakage current increases until it dominates the I–V characteristic. This phenomenon is shown graphically in FIG. 3 where the log of the modulus of the current, J, is plotted against applied voltage using experimental data and in which the initial I–V characteristic, corresponding to that of FIG. 2, is indicated by the letter A. The I–V characteristic before current stressing is typical of a TFD with an optical band gap ($E_G$) approximately equal to 2.1 eV. After taking this initial measurement, the device was given a prolonged current stress treatment until pronounced leakage occurred (curve (B) FIG. 3). A family of I/V curves, B to D, were then measured after progressively increasing stress time using alternate positive and negative current pulses at 5 A cm$^{-2}$ of 10 microseconds duration and at a frequency of 2.5 kHz. As can be seen the curves are generally symmetric about zero volts. FIG. 3 also shows that as the current stressing progresses and more defects are introduced into the layer 14 there is a corresponding increase in the leakage current. Measurements of the activation energy, $E_A$ against applied electric field indicate that as stressing continues the activation energy for current transport decreases to values small compared with the band gap and the increase in leakage current is mainly due to a change in activation energy rather than an increase in the number of centres participating in the conduction process. FIG. 4 is a graph in which the activation energy, $E_A$, is plotted against a bias voltage V (volts) for the device before this current stressing, curve 1, after current stressing and at the onset of leakage, curve 2, and after continued current stressing, curve 3. Before the onset of leakage in the device, the I–V characteristics drift out due to electron trapping in some of the induced states, as indicated by the dotted lines in FIG. 2. Leakage becomes apparent when the number of trapped electrons reaches approximately $10^{18}$ cm$^{-3}$ irrespective of how the device has been stressed, and this property together with the activation energy plots shown in FIG. 4 suggests that the mechanism responsible for the leakage current involves conduction via Frenkel-Poole emission and hopping through the defect band. A possible explanation for the change of activation energy with current stressing is that the defect band becomes broadened so that centres move closer to the band edge, or perhaps that mean distance between centres becomes reduced so that a carrier experiences a lower effective barrier height to hopping under the influence of two forces, one due to the charge on the centre from which it had been emitted and one from a nearby charged centre to which it is attracted. The effect of the defect band is illustrated in FIG. 5 which is an energy band diagram of the structure. In this diagram, Ev and Ec are respectively the energy of the valence band and the bottom of the conduction band, EFn is the quasi-Fermi level, ø'e and ø'h denote respectively the barrier heights for electrons and holes, $E'_A$ is an effective barrier height for hopping, and Frenkel-Poole emission, and Bd denotes the defect band.

One interpretation of the leakage phenomenon, therefore, is that before stressing the current density is dominated by thermionic-field emission of electrons, $J_e$, from the anode. The activation energy of the device (FIG. 4) shows that there is a difference between the height of the top and bottom barriers but they both change in the same way with electric field and the slope is consistent with thermionic-field emission of electrons having a low tunnelling effective mass. The hole current $J_{h1}$ is determined by thermionic-field emission of holes generated in the anode metal. The defect band Bd grows during current stressing until the defect centres become sufficiently close to provide a second path for holes $J_{h2}$ and sufficiently close to the valence band for them to emit holes via the Frenkel-Poole mechanism thereby causing the leakage current.

Because the defect band which is induced by hole injection and which is responsible for excess leakage grows during current stress its resistance can be determined. This feature is used to programme the device by selecting the stressing appropriately to set the activation energy level, as desired, and as will be apparent from FIG. 4. The level of the activation energy is thus determined by the defect band. More precisely the activation energy is dependent on and determined by the concentration and distribution of energies of the defects set during the programming process which can be varied in accordance with changes in the parameters of the process. Thereafter, the device, which is effectively an analogue semiconductor memory device, can be read, and its programmed state determined, using read voltages which are less than the voltages used for current stressing. Typically, the device is read by applying a READ voltage across its contacts of, for example, around one volt. The resulting current flow through the device, according to its selected I–V characteristic,(FIG. 3), will then be indicative of its programmed state.

The relationship between electrical current and the activation energy level, $E_A$, of the device can be expressed by the formula:

$$J = A\ exp-(E_A/\kappa T)$$

Where A is a constant, T is temperature and K is Boltzmann's constant.

Similar effects to those described above in the device using a silicon rich amorphous silicon nitride alloy have been found also in a device using hydrogenated, silicon rich, amorphous silicon carbide (a-SiCx:H) for the layer 14. It can be expected that current transport through defect bands is a common phenomenon in silicon rich amorphous silicon alloys, such as an hydrogenated, silicon rich, amorphous silicon oxide or oxynitride alloy. The inclusion in the silicon rich alloy material of the element nitrogen or carbon (or oxygen, or oxygen and nitrogen) as the case may be provides the necessary basis for inducing the defect band and no further element or elements are needed in the alloy to form the defects constituting the induced defect band. The amorphous silicon alloy could perhaps be doped, although preferably undoped, intrinsic, alloy is used. it is envisaged that other elements, for example germanium would be included in the alloy. The proportion of nitrogen, carbon, or other element use to form the alloy should be sufficient to have a noticeable effect on the band gap of the material.

The semiconductor memory device is non-volatile and, providing that in subsequence use reading is performed using operating voltages which are of comparatively low magnitude, no further 'programming' should occur. However, if it is desired to change its programming this can be accomplished by performing a further programming process, but the nature of such re-programming can only take the device characteristics further away from that of the unstressed device each time. Full re-programming can be carried out by subjecting the device to an annealing operation at an appropriately high temperature which will effectively wipe clean the device and return it to its original, unstressed, state following which it can then be programmed again as appropriate. Annealing can also be used to increase the activation energy level whilst not wiping the device clean.

While the described programming process used in producing the programmed semiconductor device involves electrical current stressing, it is envisaged that other techniques could be utilised to induce the desired defect band. In particular, energetic particle bombardment of a region of the layer 14 between the contact layers 12 and 15, using electrons or ions such as protons, or perhaps photons, could be used at an energy level sufficient to break internal bonds. The amount of lowering of the activation energy for transport of carriers would in this case be dependent on the extent of bombardment in terms of the amount of energy dissipated during bombardment.

The materials of the contact layers 12 and 15 can be varied. Other metals, ITO or doped amorphous silicon can be used. Electrical current through the programmed device when being read in subsequent use is generally independent of the contact material due to the fact that its operation is dominated by bulk effects. Although in the above described example, a particular thickness for the layer 14 is given, it should be appreciated that the thickness of this layer can be varied for example, between 25 nm to around 1 micrometer. Increasing the thickness will result in longer stressing times or higher voltages being required. Thinner layers could be stressed more quickly at the same voltage level. As more nitrogen or carbon is added to the alloy, in the case of silicon nitride or carbide respectively, the amount of disorder will increase with band gap and it becomes easier to produce the defect band. The dimensions of the memory device, that is, the area of overlap between the contacts 12 and 15 can also be varied.

In an alternative structural form of the device, the two conducting contact layers may be provided at spaced locations on one surface of the amorphous silicon alloy layer. For example, the layer 14 could be deposited directly in the surface of the support. Thereafter a single metal layer is deposited over the surface of the layer and patterned photolithographically to define two, separate conductive contact layers, or two separate depositions of conducting material, for example chromium and molydenum could be deposited as respective layers and patterned in succession.

An embodiment of a memory matrix device, comprising an array of the memory devices, will now be described with reference to FIGS. 6 and 7 which show parts of the device schematically in cross-sectional side view and cross-sectional plan view respectively. The device comprises a plurality of 2-D, planar, arrays of memory devices stacked upon one another in overlying relationship on a common insulating support 11, for example of glass, in a series of planes parallel to the support surface to form a multi-level, 3-D memory device structure. The memory devices 10 are arranged in rows and columns in each array, there being five arrays in the example device illustrated.

Each array comprises a set (X) of parallel, and regularly spaced, row conductors comprising metallic strips 20 extending over the support and a set (Y) of parallel, and regularly spaced, column conductors, comprising metallic strips 22, extending over the support at right angles to the set X, the planes of the two sets being spaced apart by an intervening layer of the hydrogenated silicon rich amorphous silicon alloy material 14, which in this case is a-SiNx:H whose optical band gap $E_G$ is around 2.7 eV. Thus, the first array, closest to the support surface, comprises the set of row conductors XI and the intersecting set of column conductors Y1 with the layer 14 therebetween. The memory devices in the array are situated at the cross-over regions between the row and column conductors, with each memory device being formed by a portion of a row conductor 20 and an overlying portion of a column conductor 22 at the cross-over region (constituting the contact layers 12 and 15 in FIG. 1) and the portion of the layer 14 sandwiched therebetween as is shown in FIG. 7, it being understood that the layer 14 extends continuously between the two sets of conductors. Thus, the bottom contact layers of all memory devices 10 in one column, comprising individual portions of one column conductor 22, are connected together electrically via the column conductor, and the top contact layers of all memory devices in one row, comprising individual portions of one row conductor 20, are connected together electrically via the row conductor. Each individual memory device 10 in this matrix array is, therefore, addressable via its associated row and column conductors.

The overlying arrays of memory devices are of similar form. In this embodiment, sets of row and column conductors are shared between adjacent arrays. Thus, the aforementioned set of row conductors XI serves also as the set of row conductors for the second array from the support, this array being constituted by the set XI together with the set of column conductors, Y2 and the intervening layer 14, with again, the row and column array of memory devices 10 being determined by the crossover regions of the two sets of conductors, namely XI and Y2. The positions of the address conductors of the set Y2 are staggered with respect to the positions of the conductors of the set Y1, as shown in FIG. 6, so as to reduce capacitive coupling effects. The remaining three arrays are provided in a similar manner and are constituted respectively by the pairs of sets of address conductors Y2 and X2, X2 and Y3, and Y3 and X3 together with their respective intervening layers 14. The end portions of the sets of row conductors X1, X2 and X3 are arranged in echelon fashion so as to enable contact with the individual conductors in each set in a convenient manner. The column conductors of the sets Y1, Y2 and Y3 are terminated in similar manner.

Using conventional thin film technology, the arrays are fabricated very simply in succession by building one layer on top of another. A layer of metal, for example chromium, is deposited on the surface of the support 11 and patterned photolithographically to define the conductive strips 22 constituting the set of column conductors Y1. A layer of a-SiNx:H is then grown to the required thickness on the support, and extending continuously over the set Y1 and intermediate surface areas of the support using a PECVD process, as described previously, to form the layer 14. Another layer of metal, for example chromium, or possibly molydenum, is then deposited and patterned to define the set of conductive strips 20 constituting the row conductors X1. This is followed by the deposition of another layer of a-SiNx:H to form the layer 14 for the second array, and then the deposition and patterning of another chromium layer to form the set of column conductors Y2 for the second array. A further layer of a-SiNx:H is then formed over the set Y2, and intermediate surface regions, followed by the formation of the next set of row conductors X2 to complete the third array, and so on until the final set of row conductors X3 is provided. The thicknesses of the metal layers and the width of the strips 20 and 22 formed therefrom are uniform and the same throughout. The area of each cross-over, and thus the size of a memory device, as determined by the widths of the row and column conductors, may again be around ten micrometers square although this could be varied to provide larger or smaller size memory devices as desired. The layers 14 are provided to the required thickness, at least at the cross-over regions, as previously described. The structure in FIG. 6 is depicted in simplified form and it will be appreciated that if the layers 14 are deposited merely as continuous layers of uniform thickness their surfaces will not be entirely planar as shown but will be undulating. It will be appreciated that the thin film technology entailed is very simple, requiring only six masking processes for the five arrays.

The memory matrix array device is programmed by applying voltages to individual ones of the row and column conductors in each array so as to cause an electrical current to follow through the memory device at the intersection of the row and column conductors concerned which induces a defect band in its layer 14 at the cross-over region. Read-out of the programmed devices is accomplished in a similar way by applying a read voltage across their associated row and column conductors and sensing the resulting current flow. The read-out operation may, for example, entail reading each array in turn by scanning each row conductor of an array in turn with a read voltage to select a row of memory devices and scanning the column conductors to determine the state of the individual memory devices in the selected row in a manner similar to that known for matrix memory devices.

The sharing of a set of conductors between adjacent arrays leads to a reduction in the overall number of sets required and consequent simplification of the fabrication of the structure. In the above example, only six sets of address conductors are needed for the five arrays. However, the overlying arrays of memory devices could instead each be provided with their own respective sets of row and column address conductors with a continuous layer of insulating material, for example silicon nitride or polyimide, being provided between each adjacent pair of arrays to separate them. Although the number of sets of conductors would then be increased, i.e. to ten in the above example, this approach may be advantageous to reducing possible cross-talk problems.

It will be appreciated that the number of arrays of memory devices can readily be varied and may comprise just two overlying arrays, or more than five arrays. A memory matrix array device comprising just one array of memory devices can, of course, also be provided.

The materials used for the sets of row and column conductors, providing the contact layers for the memory devices, and the hydrogenated, silicon-rich, amorphous silicon alloy material of the layers 14, and their thicknesses, can be varied as described previously. From reading the present disclosure, other modifications will be apparent to persons skilled in the art. Such modifications may involve other features which are already known in the field of amorphous silicon semiconductor devices and which may be used instead of or in addition to features already described herein.

What is claimed is:

1. A recoverable, nonelectrically switchable programmed semiconductor memory device comprising two vertically spaced, conductive, contact layers and a single layer of amorphous silicon material of a single type extending therebetween, wherein the amorphous silicon material comprises an hydrogenated, silicon rich, amorphous silicon alloy containing at least one other element in addition to silicon and hydrogen and in which the ratio of silicon to said at least one other element is greater than one, and the amorphous silicon alloy layer has a defect band therein which uniformly lowers the activation energy for transport of carriers between the conductive contact layers throughout the area of the alloy layer between the contact layers by an amount which is a function of the defect band without inducing breakdown.

2. A recoverable, nonelectrically switchable programmable semiconductor memory device comprising two vertically spaced, conductive, contact layers and a single layer of amorphous silicon semiconductor material of a single type, extending therebetween, wherein the amorphous silicon material comprises an hydrogenated, silicon-rich, amorphous silicon alloy which contains at least one other element in addition to hydrogen and silicon and in which the ratio of silicon to said at least one other element is greater than one, and which has an activation energy for the transport of carriers between the contact layers throughout the area of the alloy layer between the contact layers that is alterable by inducing a uniform defect band in the amorphous silicon alloy layer so as to program the device without inducing breakdown.

3. A device according to claim 1, characterised in that the hydrogenated, silicon rich, amorphous silicon alloy comprises a silicon rich, amorphous silicon nitride alloy.

4. A device according to claim 1, characterised in that the hydrogenated, silicon rich, amorphous silicon alloy comprises a silicon rich, amorphous silicon carbide alloy.

5. A device according to claim 1, characterised in that the amorphous silicon alloy layer is sandwiched between the two conductive contact layers.

6. A memory matrix array device comprising an array of memory devices according to claim 1 and carried on a common support.

7. A memory matrix array device according to claim 6, characterised in that the memory devices of the array are arranged in rows and columns with one of the two contact layers of each memory device in a respective row being electrically interconnected and with the other of the two contact layers of each memory device in a respective column being electrically interconnected.

8. A memory matrix array device according to claim 7, characterised in that the array comprises sets of crossing row and column conductors extending over the support which at their cross-over regions are separated by a layer of the said hydrogenated, silicon rich, amorphous silicon alloy material, each cross-over region forming a memory device whose two contact layers comprise portions of the respective row and column conductors.

9. A memory matrix array device according to claim 8, characterised in that the layers of said amorphous silicon alloy material at the cross-over regions comprise portions of a layer extending continuously over the support between the sets of row and column conductors.

10. A memory matrix array device according to claim 8, characterised in that the memory matrix array device comprises a plurality of arrays of memory devices which overlie one another on the support.

11. A memory matrix array device according to claim 10, characterised in that a set of conductors of one array serves also as a set of conductors of an adjacent array.

12. A device according to claim 2, characterized in that the hydrogenated, silicon rich, amorphous silicon alloy comprises a silicon rich, amorphous silicon nitride alloy.

13. A device according to claim 2, characterized in that the hydrogenated, silicon rich, amorphous silicon alloy comprises a silicon rich, amorphous silicon carbide alloy.

14. A device according to claim 2, characterized in that the amorphous silicon alloy layer is sandwiched between the two conductive contact layers.

15. A memory matrix array device comprising an array of memory devices according to claim 2 and carried on a common support.

* * * * *